(12) United States Patent
Takada et al.

(10) Patent No.: US 6,341,966 B1
(45) Date of Patent: Jan. 29, 2002

(54) ELECTRICAL CONNECTOR CONNECTING SYSTEM AND INTERMEDIATE BOARD SUPPORT FOR THE SAME

(75) Inventors: Toshiyuki Takada; Mitsuo Ishida, both of Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 09/704,661

(22) Filed: Nov. 3, 2000

(30) Foreign Application Priority Data

Nov. 16, 1999 (JP) .......................................... 11-324806

(51) Int. Cl.⁷ ................................................ H01R 4/66
(52) U.S. Cl. ......................................... 439/108; 439/74
(58) Field of Search .......................... 439/74, 101, 108, 439/79

(56) References Cited

U.S. PATENT DOCUMENTS

| | | | | |
|---|---|---|---|---|
| 4,869,676 A | * | 9/1989 | Demler, Jr. et al. ........ | 439/101 |
| 4,981,438 A | * | 1/1991 | Bekhiet ........................ | 439/76 |
| 5,026,292 A | * | 6/1991 | Pickles et al ................ | 439/108 |
| 5,775,923 A | * | 7/1998 | Tomioka ....................... | 439/79 |
| 5,825,630 A | * | 10/1998 | Taylor .......................... | 439/74 |
| 5,999,097 A | * | 12/1999 | Liddle et al. ................. | 439/55 |
| 6,053,747 A | * | 4/2000 | Aggus et al. ................. | 439/74 |

\* cited by examiner

*Primary Examiner*—Renee Luebke
*Assistant Examiner*—Briggitte R. Hammond
(74) *Attorney, Agent, or Firm*—Kanesaka & Takeuchi

(57) ABSTRACT

An electrical connector connection system for connecting a pair of receptacle connectors (10) comprises an intermediate board (20) which interconnects the receptacle connectors (10) and has signal and ground connection portions (21 and 22) on opposite edges thereof and signal transmission portions (24) for interconnecting corresponding signal connection portions (21) and a ground transmission portion (23) for interconnecting the ground connection portions (22).

10 Claims, 6 Drawing Sheets

ELECTRICAL CONNECTOR CONNECTING SYSTEM AND INTERMEDIATE BOARD SUPPORT FOR THE SAME

BACKGROUND OF THE INVENTION

1. Field of the Invention

The present invention relates to an electrical connector connecting system and an intermediate board support for the system.

2. Description of the Related Art

U.S. Pat. No. 4,616,893 discloses an electrical connectors assembly of this type. As shown in FIG. 6, the connection system connects two connectors 50 and 60, each of which has two rows of contact elements. The connector 50 comprises a housing 51 and a plurality of male terminals 52 each having a contact pin while the connector 60 comprises a housing 61 and a plurality of female terminals 62 therein. Each of ground plates 53 and 63 is put into a space between the two terminal rows of each of the connectors 50 and 60. The ground plates 53 and 63 are connected by a linking terminal 70 with the connection grooves 71 and 72 put into the connection notches 53A and 63A, respectively, such that the planes of the linking terminal 70 and ground plates 53 and 63 are at right angles. The connectors 50 and 60 are joined together by fitting the end portions 51A of the connector 50 over the end portions 61A of the other connector 60.

In the above connection system, the signal terminals 52 and 62 and the ground plates 53 and 63 are made of different materials, respectively, and there are housing walls between them so that there are limits to minimization of the distance between the signal terminals and the ground plates. In addition, not only it is difficult to make impedance match but also the distance is too unstable to process high-speed signals. Sometimes, these connectors are mounted on a pair of circuit boards to connect them. If one or both of the connectors are offset from the regular mounting positions, it is no longer possible to connect them.

SUMMARY OF THE INVENTION

Accordingly, it is an object of the invention to provide an electrical connector connection system suitable for process of high-speed signals and capable of absorbing small errors in the mounting positions of the connectors.

According to one aspect of the invention there is provided an electrical connector connecting system for connecting a pair of electrical connectors of the receptacle type, which comprises at least one intermediate board with opposite edges fitted into the electrical connectors to electrically connect them. The intermediate board has signal and ground connection portions on the opposite edges and signal and ground transmission portions for interconnecting the signal and ground connection portions, respectively. Both the signal and ground transmission portions are provided on the same intermediate board so that the distance between the transmission portions are minimized and constant, making impedance match and high-speed transmission possible.

Either the signal or ground transmission portion may be provided on an surface of the intermediate board, with the other within the intermediate board so that the ground transmission portion can cover a plurality of signal transmission portions, providing the improved shield effect. A pair of one guide frames support opposite ends of the intermediate board, respectively, with each guide frame having at least a pair of guide section which is fitted into the electrical connectors for determining relative positions so that mating of the intermediate board and the electrical connectors is made easy. The guide frame may have at least one lock means for locking the intermediate board to one of the electrical connectors to facilitate connection of the intermediate board to the other electrical connector. The guide sections may have different edges to prevent the electrical connectors from being connected to a wrong side of the intermediate board.

According to another aspect of the invention there is provided an electrical connector connection system comprising a pair of electrical connectors, each having at least one terminal with a flexible contact finger; and at least one intermediate board having at least a pair of connection portions provided opposite edges thereof for contact with the flexible contact finger such that the intermediate board absorbs errors in a thicknesswise direction thereof with which the electrical connectors are positioned. The resilient deformation of the contact elements allows tilt of the intermediate plate, absorbing relative positional errors of the connectors.

The electrical connector connection system further comprises a pair of guide frames for supporting opposite ends of the intermediate so as to allow tilting of the intermediate board in the thicknesswise direction. The electrical connector connection system further comprises a support member for determining a distance between the connectors, the support member having at least one connection means for connecting the intermediate board so that not only the plugging depth between the intermediate plate and the connectors can be checked but also the application of an excessive plugging force can be prevented.

The support member has a pair of opposite faces with which a pair of the intermediate boards are brought into contact for support. The support member and the intermediate boards may be detachably attached. The support member may have a pair of spherical stopper faces opposed to the electrical connectors, respectively. The spherical stopper faces may have a radius of a half of a distance between the spherical stopper faces so as to keep the distance between the connectors substantially constant even if the intermediate plate is tiled.

According to still another aspect of the invention, the support member supporting a pair of intermediate boards, comprises a connection member for connecting the intermediate boards; and a support member for contact with the intermediate boards for support, the connection and support members being made integrally as a unit. The support member comprises a pair of guide frames for supporting opposite ends of the intermediate boards; a pair of stopper faces for abutment with a pair of electrical connectors to determine a distance between them; and a connection section detachably attached to the intermediate boards. The guide frames each comprises a pair of guide sections put into the electrical connector to determine relative positions and at least one lock means for locking the electrical connector to the guide frame.

DESCRIPTION OF THE PREFERRED EMBODIMENTS

An embodiment of the invention will now be described with reference to FIGS. 1–5.

Figure 1:
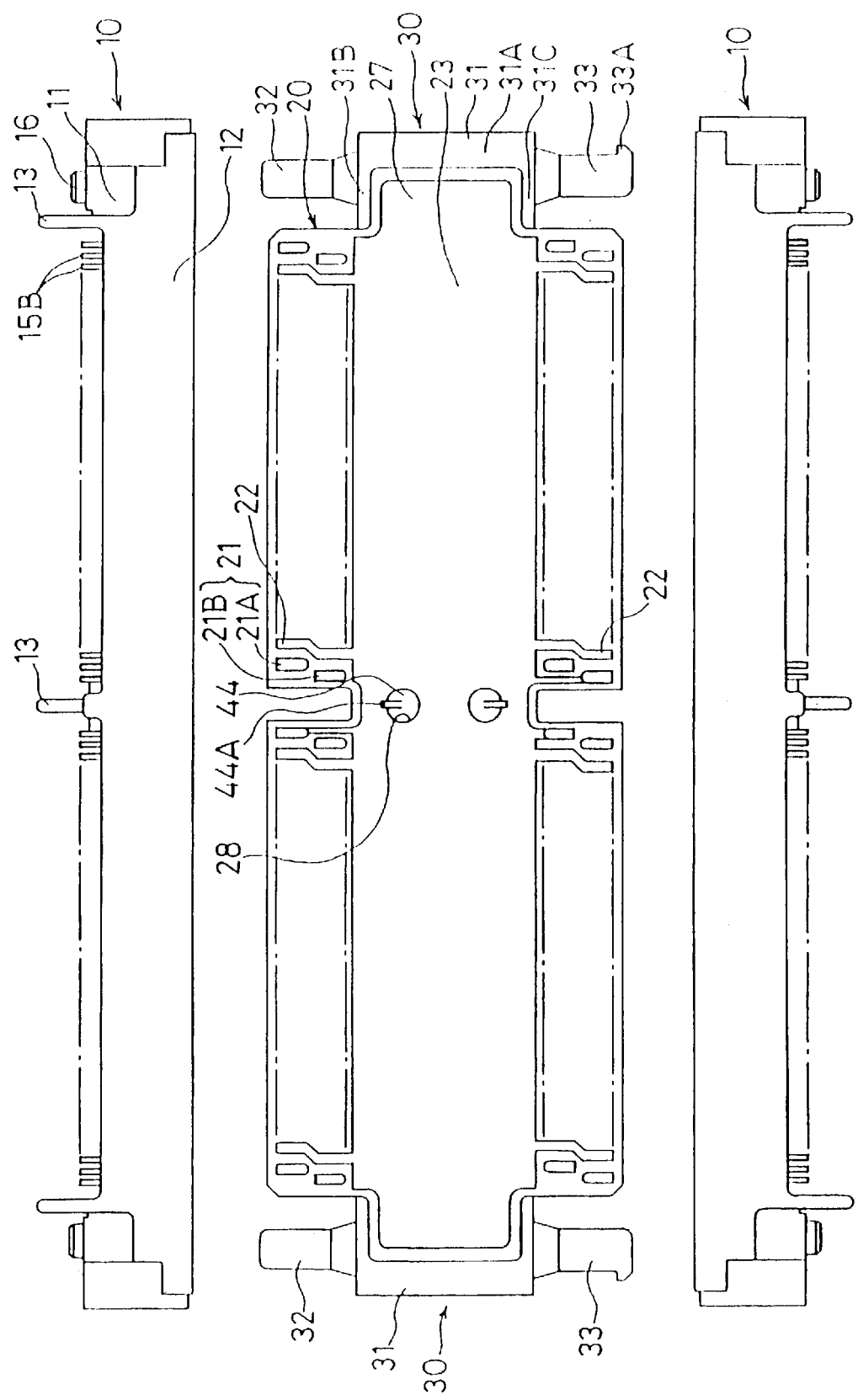
FIG. 1 is a front elevational view of an electrical connector connection system before assembly.
Figure 2:
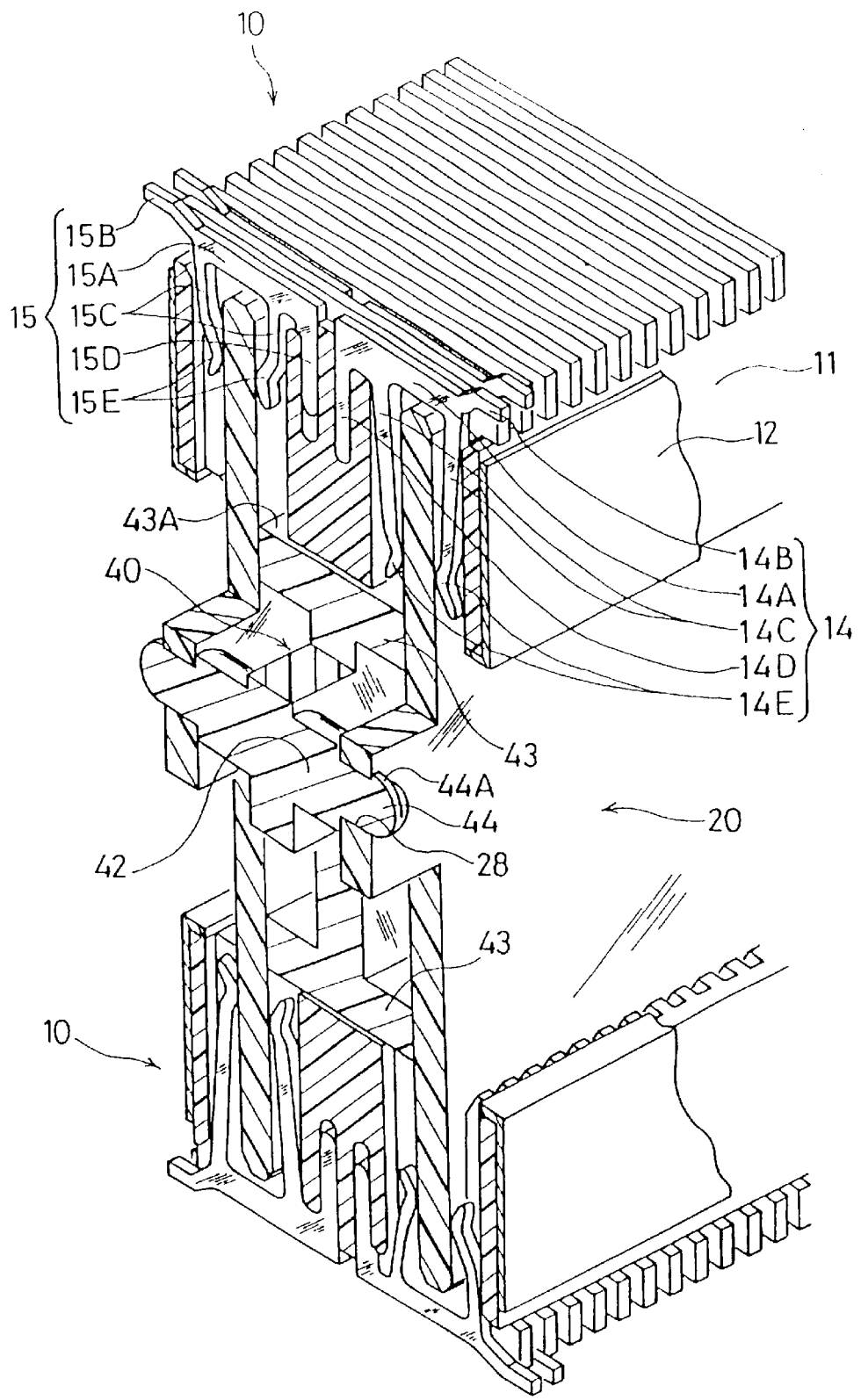
FIG. 2 is a cross-sectional perspective view of the electrical connector connection system after assembly.

In FIG. 1, an electrical connector connection system consists of upper and lower connectors 10 and an intermediate board 20 for connecting them. Each connector 10 is covered by a shield plate 12 except for both ends of a housing 11 which is made of a dielectric material. A plurality of ground legs 13 extend from opposite ends and a middle point of the shield plate 12 so as to go through apertures of circuit boards (not shown). As shown in FIG. 2, two types of female terminals 14 and 15 stamped from metal sheet are attached to the housing 12 in two rows. A terminal 14 or 15 has a straight base 14A or 15A, a connection section 14B or 15B laterally extending from the straight base 14A or 15A, a pair of spring fingers 14C or 15C and a fixed section 14D or 15D extending from the straight base 14A or 15A at right angles. The connection sections 14B and 15B are soldered to traces of circuit boards. The spring fingers 14C and 15C are different in length but both flexible and have a J-shaped contact portion 14E or 15E. The fixed sections 14D and 15D are press fitted into grooves of the housing 11 to fix the terminals 14 and 15 to the housing 11. Most of the terminals 14 and 15 are used as signal terminals but some of them are used as ground terminals.

The terminals 14 and 15 having long and short spring fingers 14C and 15C, respectively, are arranged alternately in each of the rows in the connector 10 so as to receive the intermediate board 20 between the long and short spring fingers 14C and 15C. That is, the intermediate board 20 is connected to the terminals 15 at positions close to the edge thereof and the terminals 14 at positions apart from the edge thereof.

Figure 3:
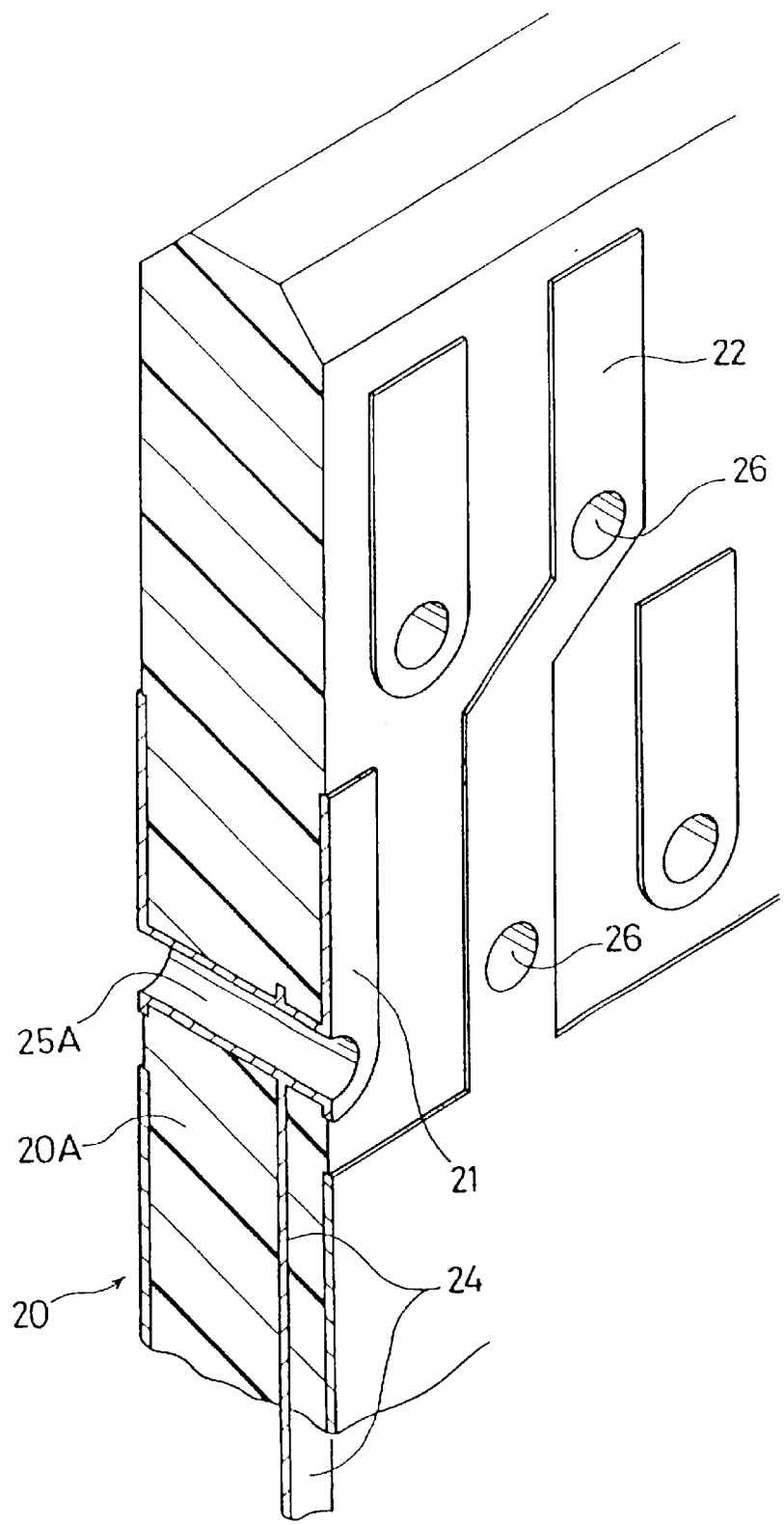
FIG. 3 is a cross-sectional perspective view of an intermediate plate for the electrical connector connection system.

In FIG. 1, a pair of positioning columns 16 are provided at opposite ends of the housing 11 for positioning the connector relative to the circuit board. A plurality of signal connection portions 21A and 21B are arranged at regular intervals on the upper and lower edges on both surfaces of the intermediate board 20. A few of the signal connection portions 21 are replaced by ground connection portions 22. The signal and ground connection portions 21 and 22 are communicated by transmission portions, respectively. That is, the ground connection portions 22 are communicated by a ground transmission section 23 while, as shown in FIG. 3, the signal connection portions 22 are communicated by a signal transmission section 24 which is embedded in a substrate 20A of dielectric material of the intermediate board 20 and has a width equal to the width of the signal connection portions 21. The signal transmission section 24 and the signal connection portions 21 are connected to each other by short-circuit portions 25 which are formed on the inner side walls of apertures of the substrate 20A to connect the signal connection portions 21 on both the surfaces of the substrate 20A. Similarly, the ground connection portions 22 on both the surfaces are connected by short-circuit portions 26.

In FIG. 2, a pair of the intermediate boards 20 are held by the female signal terminals 14 and 15 in the respective rows so that contact sections 14E and 15E are brought into contact with the signal and ground connection portions 21 and 22 to electrically connect the upper and lower connectors 10. The terminals 14 and 15 in contact with the signal and ground connection portions are called signal and ground terminals, respectively. Since the spring fingers 14C and 15C having the contact sections 14E and 15E are flexible, even if one or both of the connectors 10 are mounted on circuit boards at positions slightly different from the predetermined positions, the intermediate board 20 is able to tilt and absorb the error.

Figure 4:
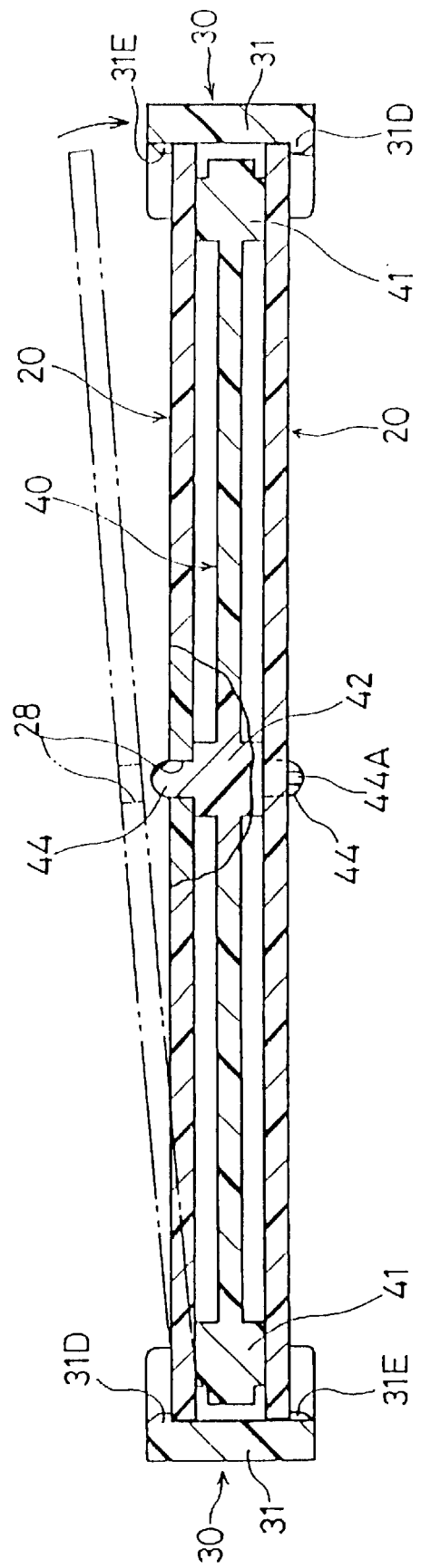
FIG. 4 is a longitudinal sectional view of the electrical connector connection system.

In FIG. 4, it is preferred to provide a pair of guide frames 30 and a support member 40 to facilitate attachment of the intermediate board 20 to the connectors 10. The guide frames 30 are situated at opposite the ends of the intermediate boards 20. The support member 40 is situated between the guide frames 30. The guide frames 30 and the support member 40 are formed integrally or separately such that the guide frames 30 do not block the tilting capability of the intermediate boards 20 relative to the connectors 10.

In FIG. 1, each guide frame 30 comprises a C-shaped body section 31 and a guide section 32. The body section 31 consists of a column portion 31A and a pair of flange portions 31B and 31C to form the C-shaped structure. An protruded end section 27 of the intermediate board 20 is put into a space in the C-shaped structure from the direction perpendicular to the sheet. As shown in FIG. 4, a stopper portion 31D for positioning the intermediate board 20 upon insertion and an engaging projection 31E are provided on the column portion 31A so as to abut a surface of the intermediate board 20.

Guiding pins 32 and 33 extend upwardly and downwardly from the upper and lower flange portions 31B and 31C, respectively. It is preferred that the guiding pins 32 and 33 are different in form and/or dimensions to differentiate the upper and lower sides of the intermediate board 20. The guiding pins 32 and 33 are put into guiding holes (not shown) in the housing 11 for positioning. A locking craw 33A is provided on one of the guiding portion 33 for engagement with the housing 11 to prevent separation of the guiding pin 33 from the housing 11.

In FIG. 4, the support member 40 has thickened support sections 41 and 42 at opposite ends and a middle point and upper and lower flange portions 43 with stopper faces 43A (FIG. 2). The distance between the upper and lower stopper faces 43A is substantially equal to the predetermined distance between the two connectors 10. The thickness of the support portions 41 and 42 and flange portions 43 is set to space the intermediate boards 20 at a predetermined distance. The predetermined distance is set so that the distance between the outer faces of the intermediate boards 20 is substantially equal to the distance between the stopper portion 31D and the engaging projection 31E of the guide frame 30. A pair of connection projections 44 extend from the support portion 42 and has a diameter able to pass an aperture 28 of the intermediate boards 20. A plurality of ridge portions 44A extend along the semi-circular head of a connection projection 44 for engagement with the edge of the aperture 28.

A pair of the connectors are connected as follows.

(1) The connectors 10 are attached and electrically connected to respective circuit boards (not shown) by soldering the connection sections 14B and 15B of terminals 14 and 15, respectively, to the corresponding circuit traces.

(2) The intermediate boards 20 are attached to the guide frames 30 and the support body 40. As shown by a phantom line in FIG. 4, an end of each intermediate board 20 is engaged with the stopper portion 31D of the guide frame 30, and the other end is snapped into the engaging projection 31E such that the central aperture 28 of the intermediate board 20 is fitted over the connection portion 44 so that the flange portion 44A engages with the edge of the central aperture 28. Where the guide frames 30 and the support body 40 are separate members, the intermediate board 20 is attached to the support body 40 and, then, supported by the guide frames 30.

(3) In this embodiment, the connector 10 is first fitted over the guide sections 33 with the lock claws 33A. When the guide sections 33 are guided into the guide holes (not shown) of the connector 10 to a predetermined depth, the lock claws 33A engage with the housing to prevent separation while the intermediate boards 20 are put into the female terminals 14 and 15 so that the contact sections 14E and 15E are brought into contact with the signal and ground connection sections 21 and 22, respectively, under contact pressures. The abutment of the stopper face 43A of the support body 40 against the housing 11 prevents the insertion of the intermediate board 20 into the connector 10 beyond a predetermined level.

(4) In this way, the intermediate boards 20 are connected to the other connector 10 while the first connector 10 is prevented from coming off by the lock claws 33A of the guide frames 30. Thus, the terminals of the connectors are electrically connected via the intermediate boards.

Figure 5:
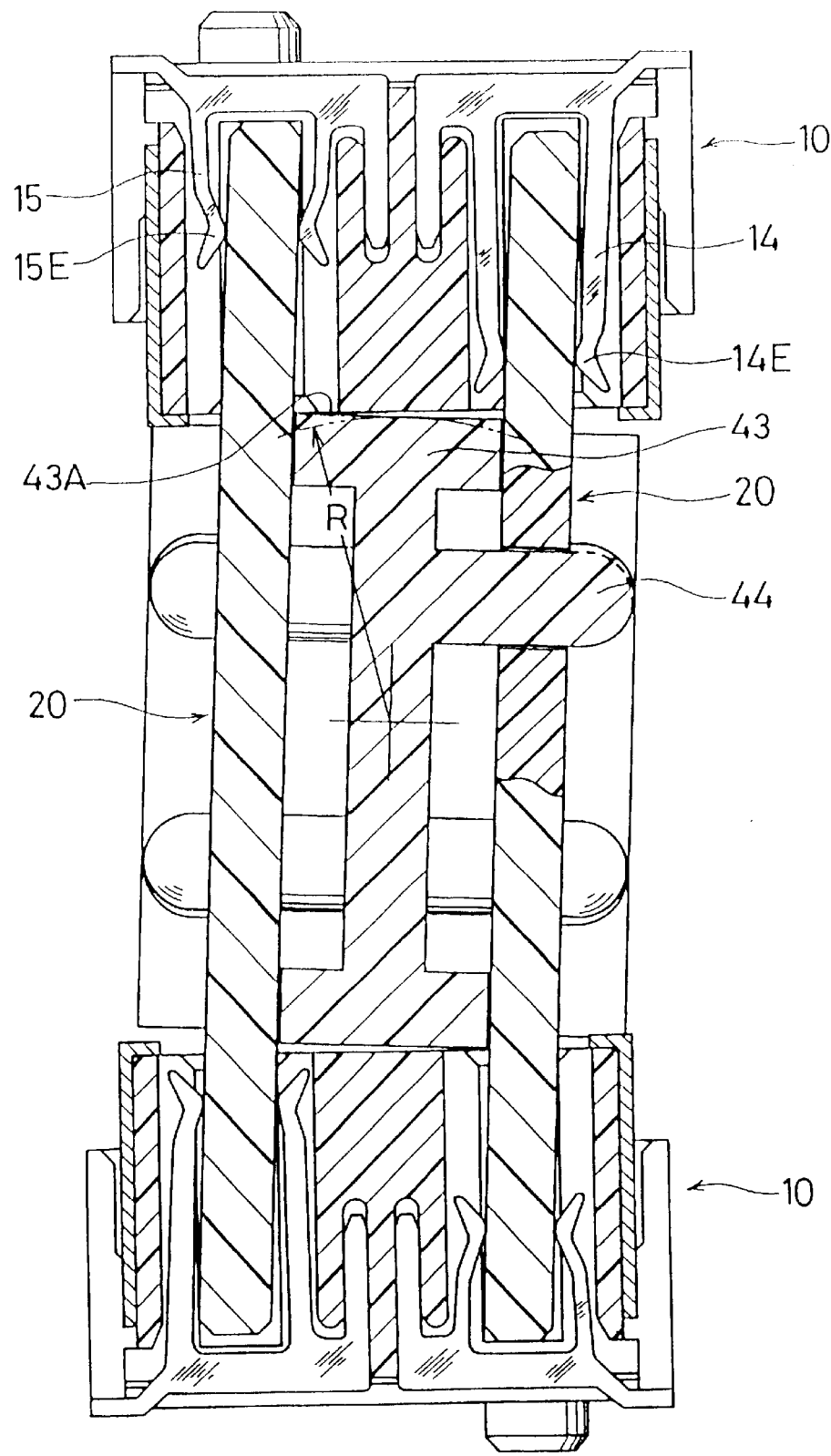
FIG. 5 is a cross-sectional view of the electrical connector connection system.
Figure 6:
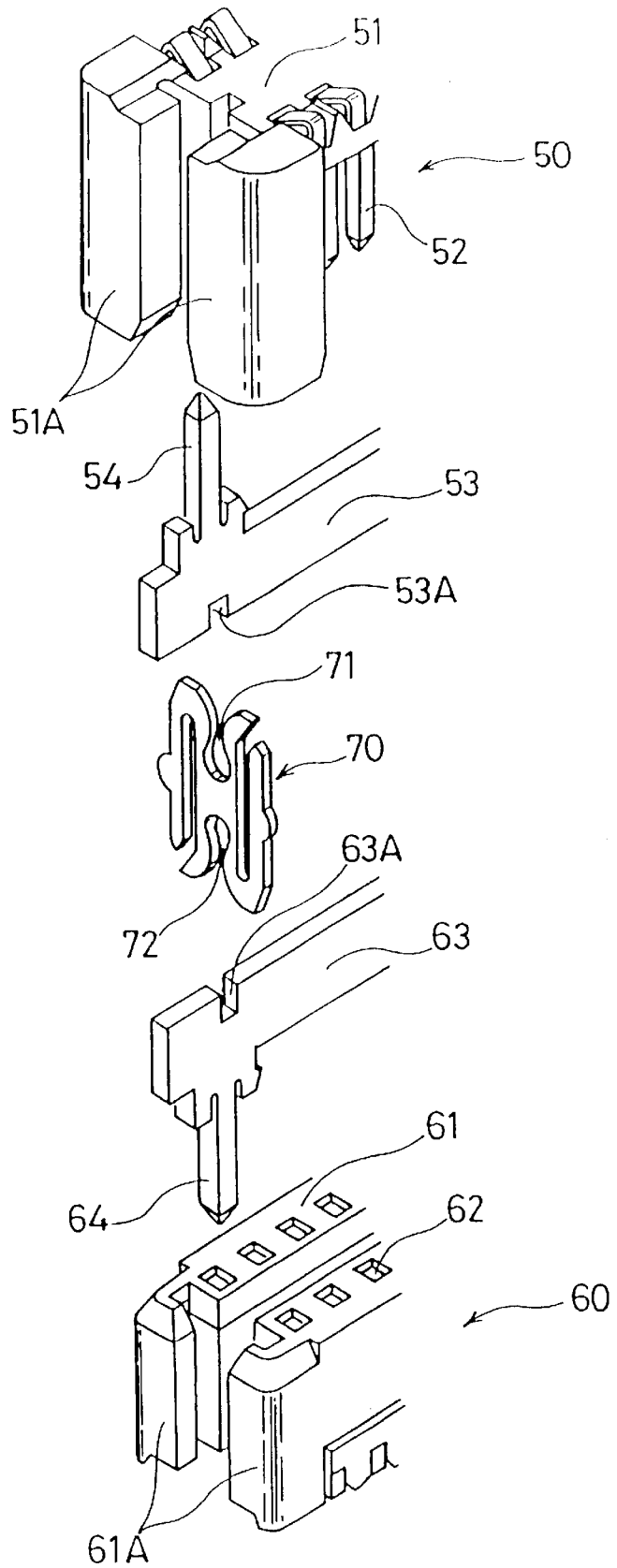
FIG. 6 is an exploded perspective view of a conventional connection system.

(5) As shown in FIG. 5, where there is a gap in the thicknesswise direction of the intermediate board between the positions where a pair of connectors are attached to respective circuit boards, the flexible fingers 14C and 15C of terminals 14 and 15 are flexed, allowing the intermediate board 20 to tilt and absorb the gap. If the stopper face 43A is provided with a curved surface having a radius of a half of the distance between the upper and lower stopper faces 43A, the tilting is made smoothly without changing the set distance between the connectors.

The present invention is not limited to the illustrated embodiments. As described above, the guide frames and the support body may be made integral as a unit or separate members. In either case, it is necessary that the guide frames allow tilting of the support body because the guiding section of the guide frames are firmly incorporated in the connector. The intermediate board may be supported by either the support body or the guide frames, and the other member is omitted. Furthermore, the connectors are supported by only the intermediate boards, eliminating both of the support body and the guide frames.

The support body may be made to support only one intermediate board, or a plurality of support bodies are provided to link three or more intermediate boards, forming a connection assembly which connects a pair of connectors, each having an equal number of terminal rows. The intermediate board may be made in the same plane as the signal and ground transmitting sections forming a pair of parallel strips. The connector may have only a single row of flexible fingers held between the housing and the intermediate board.

According to one aspect of the invention, both the signal and ground transmitting sections are formed on a single intermediate board so that the distance between them is remarkably reduced and constant, making impedance match and high-speed transmission possible. Even if the distance between both the connectors becomes large, it is easy to make impedance match on the intermediate board, maintaining the high-speed transmission characteristics. The intermediate board connected to both the connectors are able to tilt so that they can absorb an error in positions where the connectors are attached to respective circuit boards. Also, it is possible to support a plurality of intermediate boards without difficulty.

What is claimed is:

1. An electrical connector connecting system for connecting a pair of electrical connectors, comprising:
   at least one intermediate board fitted into said electrical connectors at opposite edges thereof to electrically connect said electrical connectors, said intermediate board having signal and ground connection portions on said opposite edges and signal and ground transmission portions for interconnecting said signal and ground connection portions, respectively; and
   a pair of guide frames for supporting opposite ends of said intermediate board, respectively, each guide frame having at least a pair of guide sections which is fitted into said electrical connectors for determining relative positions.

2. The electrical connector connecting system according to claim 1, wherein said each guide frame has at least one lock means for locking said intermediate board to one of said electrical connectors while said intermediate board is being connected to the other electrical connector.

3. The electrical connector connecting system according to claim 1, wherein said guide sections have different edges to prevent said electrical connectors from being connected to a wrong side of said intermediate board.

4. An electrical connector assembly comprising:
   a pair of electrical connectors, each having at least one terminal with a flexible contact finger;
   at least one intermediate board having at least a pair of connection portions provided opposite edges thereof for contact with said flexible contact finger such that said intermediate board absorbs errors in a thicknesswise direction thereof with which said electrical connectors are positioned; and
   a pair of guide frames for supporting opposite ends of said intermediate board such that it allows tilting of said intermediate board in said thicknesswise direction.

5. The electrical connector assembly according to claim 4, which further comprises a support member for determining a distance between said connectors, said support member having at least one connection means for connecting said intermediate board.

6. The electrical connector assembly according to claim 5, wherein said support member has a pair of opposite faces with which a pair of said intermediate boards are brought into contact for support.

7. The electrical connector assembly according to claim 5, wherein said support member and said intermediate boards are detachably attached.

8. The electrical connector assembly according to one of claims 5–7, wherein said support member has a pair of spherical stopper faces opposed to said electrical connectors, respectively.

9. The electrical connector assembly according to claim 8, wherein said spherical stopper faces have a radius of a half of a distance between said spherical stopper faces.

10. A support member supporting a pair of intermediate boards, said support member comprising:
    connection means for connecting said intermediate boards;
    support means for contact with said intermediate boards for support, said connection and support means being made integrally as a unit;
    a pair of guide frames for supporting opposite ends of said intermediate boards;
    a pair of stopper faces for abutment with a pair of electrical connectors to determine a distance between them; and a connection section detachably attached to said intermediate boards, and said guide frames each comprising:

a pair of guide sections put into said electrical connector to determine relative positions and at least one lock means for locking said electrical connector to said guide frame.

* * * * *